United States Patent
Chen

(10) Patent No.: US 7,659,771 B2
(45) Date of Patent: Feb. 9, 2010

(54) DIFFERENTIAL CHARGE PUMP

(75) Inventor: Mu-Jung Chen, Kaohsiung (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 11/674,701

(22) Filed: Feb. 14, 2007

(65) Prior Publication Data
US 2007/0188205 A1 Aug. 16, 2007

(30) Foreign Application Priority Data
Feb. 16, 2006 (TW) .............................. 95105273 A

(51) Int. Cl.
*G05F 1/10* (2006.01)

(52) U.S. Cl. ...................... 327/536; 327/537

(58) Field of Classification Search ........................ None
See application file for complete search history.

(56) References Cited

U.S. PATENT DOCUMENTS

| | | | |
|---|---|---|---|
| 6,169,458 B1 * | 1/2001 | Shenoy et al. ................. | 331/17 |
| 6,515,536 B2 | 2/2003 | Liang et al. | |
| 6,815,988 B2 * | 11/2004 | Sanduleanu ................. | 327/157 |
| 6,876,244 B1 * | 4/2005 | Moraveji .................... | 327/374 |
| 7,075,348 B2 | 7/2006 | Hsu et al. | |
| 2003/0034813 A1 * | 2/2003 | Sanduleanu ................. | 327/157 |
| 2005/0083090 A1 * | 4/2005 | Moraveji .................... | 327/157 |
| 2006/0125538 A1 * | 6/2006 | Darabi ........................ | 327/157 |
| 2006/0181938 A1 * | 8/2006 | Sohn ..................... | 365/189.11 |
| 2006/0220711 A1 * | 10/2006 | Sanduleanu et al. ......... | 327/157 |
| 2007/0001723 A1 * | 1/2007 | Lin ............................ | 327/156 |
| 2007/0176655 A1 * | 8/2007 | Dvorak et al. ................ | 327/157 |
| 2007/0188205 A1 * | 8/2007 | Chen .......................... | 327/157 |
| 2008/0007305 A1 * | 1/2008 | Lin et al. ..................... | 327/105 |
| 2008/0191758 A1 * | 8/2008 | Dykstra ....................... | 327/157 |

FOREIGN PATENT DOCUMENTS

| TW | 531965 | 5/2003 |
|---|---|---|
| WO | 2005022752 | 3/2005 |

OTHER PUBLICATIONS

Patent No. 7,075,348 as English Abstract for TW531965, USP 7,075,348 (Jul. 11, 2006).
"A 2 V 900 MHz CMOS Phase-Locked Loop" Tsorng et al., 1998, pp. 52-53.
"A Subpicosecond Jitter PLL for Clock Generation in 0.12-μm Digital CMOS" Da Dalt, et al., 2003, pp. 1275-1278.

* cited by examiner

*Primary Examiner*—Tuan Lam
*Assistant Examiner*—Hiep Nguyen
(74) *Attorney, Agent, or Firm*—Thomas, Kayden, Horstemeyer & Risley

(57) ABSTRACT

A differential charge pump includes a differential charge pump unit, current adjusting device, and common mode voltage control circuit. The differential charge pump unit is used for generating a output voltage signal according to a pump-up signal and a pump-down signal. The current adjusting device is coupled to the differential charge pump unit for providing an adjusting current signal to the differential charge pump unit as the pump-up signal and pump-down signal are both enabled or disabled. The control circuit is coupled to the differential charge pump unit for outputting a feedback signal to the differential charge pump unit according to the output voltage signal.

10 Claims, 1 Drawing Sheet

DIFFERENTIAL CHARGE PUMP

This application claims the benefit of Taiwan application Serial No. 95105273, filed Feb. 16, 2006, the subject matter of which is incorporated herein by reference.

BACKGROUND OF THE INVENTION

1. Field of the Invention

The invention relates in general to a charge pump, and more particularly to differential charge pump.

2. Description of the Related Art

Referring to "A Subpicosecond Jitter PLL for Clock Generation in 1.12-um Digital CMOS" written by Nicola Da Dalt and Christoph Sandner and published in book 38, period 7 of a solid-state device journal in July by IEEE, the journal discloses a conventional charge pump which uses an operational amplifier to generate a feedback control voltage. However, when the charge pump is initialized, it needs another operational amplifier to stabilize a voltage drop between nodes of a charge switch and discharge switch so as to prevent voltage instability due to floating.

SUMMARY OF THE INVENTION

The invention is directed to a differential charge pump for solving the prior-art issue.

According to the present invention, a differential charge pump is provided. The differential charge pump includes a differential charge pump unit, current adjusting device, and common mode voltage control circuit. The differential charge pump unit is used for generating a output voltage signal according to a pump-up signal and a pump-down signal. The current adjusting device is coupled to the differential charge pump unit for providing an adjusting current signal to the differential charge pump unit as the pump-up signal and pump-down signal are both enabled or disabled. The control circuit is coupled to the differential charge pump unit for outputting a feedback signal to the differential charge pump unit according to the output voltage signal.

The invention will become apparent from the following detailed description of the preferred but non-limiting embodiments. The following description is made with reference to the accompanying drawings.

DETAILED DESCRIPTION OF THE INVENTION

Figure 1:
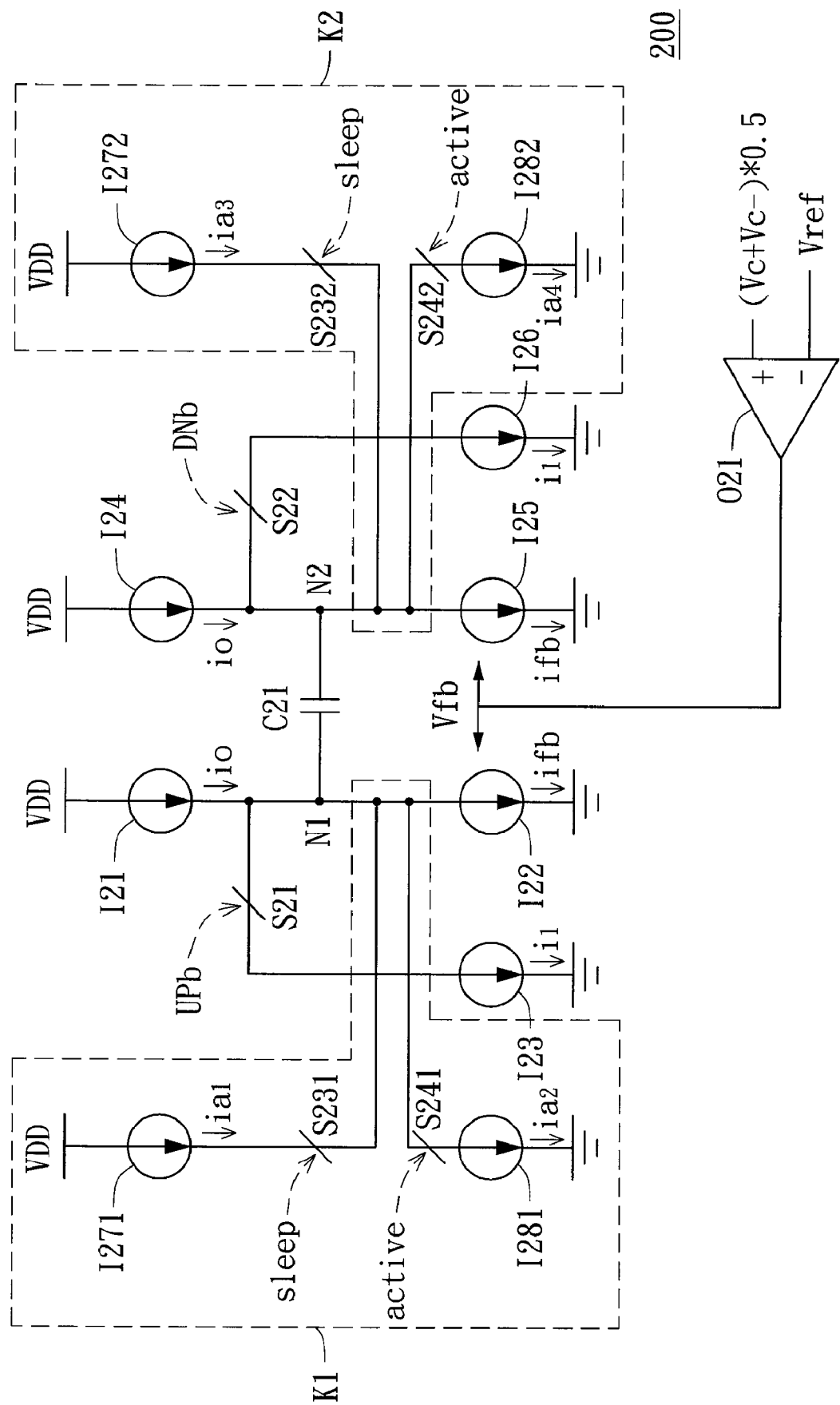
FIG. 1 is a circuit diagram of a differential charge pump according to a preferred embodiment of the invention.

Referring to FIG. 1, a circuit diagram of a differential charge pump according to a preferred embodiment of the invention is shown. A differential charge pump 200 includes current sources I21~I26, switches S21 and S22, a capacitor C21, an operational amplifier O21, and current adjusting devices K1 and K2. The differential charge pump is applied to a differential phase detector (DPD) of a DVD preamp for instance.

The current source I21 provides a current i0 to a node N1. An input terminal of the current source I25 is coupled to the node N2 and the current source I25 is controlled by an adjusting signal or feedback signal Vfb to control the current ifb matching a desired value and control the common mode voltage of the output node N1 and output node N2. The switch S22 has one terminal coupled to the node N2 and another terminal coupled to an input terminal of the current source I26. The switch S22 is controlled by an inverse-phase pump-down signal DNb, and the current source I26 supplies a current i1.

The capacitor has one end coupled to the node N1 and the other end coupled to the node N2. The operational amplifier O21 is used for receiving a reference voltage Vref, and a voltage (Vc++Vc−)/2 generating by common mode detector, and accordingly outputting the adjusting signal Vfb to control the current source I22 and I25 to stabilize the voltages Vc+ and Vc− and control the common mode voltage of the voltages Vc+ and Vc− being equal to the reference voltage Vref; wherein the Vc+ is the output voltage at node N1 and Vc− is the output voltage at node N2. It is noticed that the adjusting signal Vfb could be feedback to the current source I21 and I24, not limited in feedback to the current source I22 and I25.

The current adjusting device K1 is coupled to the node N1 for providing or compensating an adjusting current ia1 or ia2 to maintain the current flowing by the current source I22 to be the stable current ifb. The current adjusting device K1 includes a switch S231 and current source I271. The current source I271 is used for providing the adjusting current ia1. The switch S231 has one terminal coupled to an output terminal of the current source I271 and another terminal coupled to the node N1. The switch S231 is control by a sleep signal, which is a NOR value of pump-up signal UP and pump-down signal DN. The inverse-phase pump-up signal UPb is inverse in phase to the pump-up signal UP and the inverse-phase pump-down signal DNb is inverse in phase to the pump-down signal DN.

The current adjusting device K1 can further include a current source I281 and switch S241. The current source I281 and switch S241 are operating at the time of pump-up signal UP and pump-down signal DN are both enabled. The current source I281 is used for providing the adjusting current ia2. The switch S241 has one terminal coupled to an input terminal of the current source I281 and another terminal coupled to the node N1. The switch S241 is controlled by an active signal, which is an AND value of the pump-up signal UP and the pump-down signal DN. When the switch S241 is turned on, the adjusting current ia2 flows from the node N1 to the current source I281.

The current adjusting device K2 is coupled to the node N2 for providing or compensating an adjusting current ia3 or ia4 to maintain the current flowing by the current source i25 to be the stable current ifb. The current adjusting device K2 includes a current source I272 and switch S232. The current source I272 is used for providing an adjusting current ia3. The switch S232 has one terminal coupled to an output terminal of the current source I272 and another terminal coupled to the node N2. The switch S232 is controlled by the sleep signal.

The current adjusting device can further include a current source I282 and switch S242. The current source I282 and switch S242 are operating at the time of pump-up signal UP and pump-down signal DN are both enabled. The current source I282 is used for providing the adjusting current ia4. The switch S242 has one terminal coupled to an input terminal of the current source I282 and another terminal coupled to the node N2. The switch S242 is controlled by the active signal.

The following description illustrates how these signals operate the differential charge pump 200. In the embodiment, the adjusting currents ia1~ia4 have the following relation:

$$ia1=ia2=ia3=ia4=i1/2$$

The stable constant current ifb, currents i0 and i1 have the flowing relation:

$$Ifb = i0 - i1/2$$

When the pump-up signal is enabled and the pump-down signal is disabled, the switch S21 is turned off, the switch S22 is turned on and the switches S231, S232, S241 and S242 are all turned off. The current source I21 outputs the current i0 such that keep i1/2 (io−ifb) current to charge the node N1 and the current source I22 can substantially maintain the stable current ifb, that is, i0−i1/2.

The current source I24 output the current i0 to the node N2 and the current source I26 needs to supply the current i1 such that keep i1/2 current to discharge the node N2 and the current source I25 can substantially maintain the stable current ifb, that is, i0−i1/2. Therefore, the dynamic range for the operational amplifier O21 of the current source I25 can be reduced.

When the pump-up signal UP is disabled and the pump-down signal DN is enabled, the switch S22 is turned off, the switch S21 is turned on and switched S231, S232, S241 and S242 are all turned off. The current source I24 outputs the current i0 such that keep i1/2 (io−ifb) current to charge the node N2 and the current source I25 can substantially maintain the stable current ifb, that is, i0−i1/2.

The current source I21 supplies the current i0 to the node N1 and the current source I23 needs to supply the current i1 such that keep i1/2 current to discharge the node N1 and the current source I22 can substantially maintain the stable current ifb, that is, i0−i1/2. Therefore, the dynamic range for the operational amplifier O21 of the current source I22 can be reduced.

When the pump-up signal UP and the pump-down signal DN are both disabled, that is, the differential output nodes N1 and N2 of the charge pump 200 doesn't being charged or discharged. Under this situation, the sleep signal is enabled such that the switches S21, S22, S231, S232 are turned on and the switches S241 and S242 are turned off.

The current source I21 outputs the current i0 and current source I23 needs to supply the current i1 such that the stable current ifb is i0−i1 and thus the operational amplifier O21 needs to control the stable current ifb of the current source I22 to rise up to i0−i1/2. It will result in instability of the voltage Vc+ at the node N1. However, the current source I271 outputs the adjusting current ia1 equal to i1/2 to the node N1 such that the stable current ifb of the current source I22 has the value i0−i1/2 naturally. Therefore, the voltage Vc+ at the node N1 can be avoided to have too large swing.

The current source I24 outputs the current i0 and current source I25 needs to supply the current i1 such that the stable current ifb is i0−i1 and thus the operational amplifier O21 needs to control the stable current ifb of the current source I25 to rise up to i0−i1/2. It will result in instability of the voltage Vc− at the node N2. However, the current source I272 outputs the adjusting current ia3 equal to i1/2 to the node N2 such that the stable current ifb of the current source I25 has the value i0−i1/2 naturally. Therefore, the voltage Vc− at the node N2 can be avoided to have too large swing. At the time, no current flows by the capacitor C21.

When the pump-up signal UP and pump-down signal DN are both enabled, that is, the differential output nodes N1 and N2 of the charge pump 200 doesn't being charged or discharged as well. Under this situation, the switches S241 and S242 are turned on and the switches S21, S22, S231 and S232 are turned off. When the current source I21 outputs the current i0 to the node N1, the switch S241 is turned on and current source I281 needs to generate the adjusting current ia2 equal to i1/2 such that the stable current ifb of the current source I22 is i0−i1/2 naturally.

When the current source I24 outputs the current i0 to the node N2, the switch S242 is turned and the current source I282 needs to generate the adjusting current ia4 equal to i1/2 such that the stable current ifb of the current source I25 is i0−i1/2 naturally. At the time, no current flows by the capacitor C21.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A differential charge pump, comprising:
    a differential charge pump unit, for outputting an output voltage signal according to a pump-up signal and a pump-down signal;
    a current adjusting device, coupled to the differential charge pump unit for providing an adjusting signal to the differential charge pump unit as the pump-up signal and pump-down signal are both in same logic value; and
    a feedback control circuit, coupled to the differential charge pump unit, for outputting a feedback signal to the differential charge pump unit according to the output voltage signal;
    wherein the feedback control circuit comprises an operational amplifier configured to output the feedback signal according to the output voltage signal.

2. The differential charge pump according to claim 1, wherein the differential charge pump unit comprises:
    a feedback control current source, for outputting a feedback current to control the output voltage signal according to the feedback signal.

3. The differential charge pump according to claim 1, wherein the current adjusting device comprises:
    a first current source, for providing the adjusting signal as the pump-up signal and the pump-down signal are both disabled; and
    a second current source, for providing the adjusting signal as the pump-up signal and pump-down signal are both enabled.

4. The differential charge pump according to claim 1, wherein the output voltage signal is a differential output voltage signal.

5. The differential charge pump according to claim 1, wherein the feedback signal is used for controlling the common mode voltage of the output voltage signal.

6. The differential charge pump according to claim 1, is applied to a differential phase detector (DPD) of a DVD preamp.

7. A charge pump, having an output, for outputting a differential output voltage on the output according a pump-up signal and a pump-down signal, the charge pump comprising:
    a first current source, coupled to the output, for providing a first current to charge the output;
    a second current source, coupled to the output, for providing a second current to discharge the output;
    a current adjusting device, coupled to the output, for providing an adjusting current to the output as the pump-up signal and pump-down signal are both in the same logic value; and a feedback control circuit, coupled to the output, for generating a feedback signal to control the first current source or the second current source according to the differential output voltage;
wherein the feedback control circuit comprises an operational amplifier configured to output the feedback signal according to the differential output voltage and a reference voltage.

8. The charge pump according to claim 7, wherein the current adjusting device comprises:
a third current source, for providing the adjusting current as the pump-up signal and the pump-down signal are both disabled; and
a fourth current source, for providing the adjusting current as the pump-up signal and pump-down signal are both enabled.

9. The charge pump according to claim 7, wherein the common mode voltage of the differential output voltage is substantially equal to the reference voltage.

10. The charge pump according to claim 7, is applied to a differential phase detector (DPD) of a DVD preamp.

* * * * *